United States Patent [19]

Bausman, Jr.

[11] Patent Number: 5,262,675
[45] Date of Patent: Nov. 16, 1993

[54] LASER DIODE PACKAGE

[75] Inventor: Marvin D. Bausman, Jr., Chippewa Falls, Wis.

[73] Assignee: Cray Research, Inc., Eagan, Minn.

[21] Appl. No.: 927,874

[22] Filed: Aug. 10, 1992

Related U.S. Application Data

[63] Continuation of Ser. No. 641,812, Jan. 16, 1991, abandoned, which is a continuation of Ser. No. 396,554, Aug. 21, 1988, abandoned.

[51] Int. Cl.$^5$ .......................................... H01L 25/04
[52] U.S. Cl. .................... 257/714; 257/680; 372/35
[58] Field of Search ............... 357/82, 72, 17, 81; 375/36; 257/680, 714, 715; 372/35

[56] References Cited

U.S. PATENT DOCUMENTS

| 2,888,619 | 5/1959 | Hammes | 357/72 |
| 2,898,474 | 9/1956 | Rutz | 357/72 |
| 3,508,100 | 11/1967 | Tillays et al. | 357/82 |
| 3,753,149 | 8/1973 | Kindl et al. | 372/35 |

FOREIGN PATENT DOCUMENTS

| 57-141986 | 9/1982 | Japan | 372/35 |
| 61-206284 | 9/1986 | Japan | 357/82 |

OTHER PUBLICATIONS

*Patent Abstracts of Japan,* vol. 11, No. 41 (E-145) Feb. 6, 1987, & JP, A., 61206284 (Toshiba Corp.) Sep. 12, 1986.
*Patent Abstracts of Japan,* vol. 2, No. 153 (E-79) Dec. 22, 1978, & JP, A, 53121639 (Mitsubihi Denki D.K. Nov. 24, 1978).
*Patent Abstracts of Japan,* vol. 13, No. 463 (E-833) Oct. 19, 1989 & JP, A, 01179483 (Canon, Inc.) Jul. 17, 1989.
Resnick et al. "Physics", ©1966, 552-553.
*Patent Abstracts of Japan,* vol. 8, No. 250 (E-279) Nov. 16, 1984 & JP, A, 59125643 (Fujitsu K.K.) Jul. 20, 1984.
*IBM Technical Disclosure Bulletin,* vol. 18, No. 7, Dec. 1975, IBM Corp., (Armonk, N.Y., U.S.), H. E. Korth: "Optical Multichannel Connection of Integrated Modules", p. 2187.

*Primary Examiner*—Jerome Jackson
*Assistant Examiner*—D. Monin
*Attorney, Agent, or Firm*—Merchant, Gould, Smith, Edell, Welter & Schmidt

[57] ABSTRACT

A semiconductor mounting package is provided which permits the active p-n junction of a light emitting semiconductor to be operated in a liquid heat transfer fluid. The package provides optical coupling for extracting light energy.

1 Claim, 3 Drawing Sheets

LASER DIODE PACKAGE

This is a continuation-in-part of application Ser. No. 07/641,812 filed Jan. 16, 1991 now abandoned, which was a continuation of application Ser. No. 07/396,554, filed Aug. 21, 1989, now abandoned.

DESCRIPTION OF THE PRIOR

The invention relates to a package for a semiconductor device and more particularly, to a liquid cooled package for use with a light emitting laser diode.

Semiconductor devices are usually operated in sealed packages to prevent contamination of the semiconductor. Various types of packaging have been adopted for this purpose. In operation the package performs several functions. For example, active semiconductors which have electrical power supplied to them typically use the package as a radiating surface to remove heat generated by the semiconductor device. In the case of high power semiconductor diodes it is conventional to mount the P-N junction structure so that he anode is electrically and thermally coupled to a metal stud. The stud then operates as a heat sink and an electrical connection.

In light emitting diodes, the P-N junction is forward biased and light is generated at this junction. The light is emitted at right angles to the junction plane in the case of the LED and parallel to the junction plane in the case of a LASER diode. Depending upon the application, a Laser diode may be supplied in a package with a transparent window or with a fiber optic pig-tail. In either case the transparent medium is aligned with the plane of the p-n junction and is used to extract the optical power from the diode.

Monitoring of the package temperature is conventional in this art. LASER diodes are susceptible to thermal runaway and as a consequence temperature based feedback is used to control drive current. Cooling of the P-N junction in prior art packaged has been through the use of thermal conduction from the semiconductor to a heat sink. In some cases thermoelectric cooling or Peltier effect devices are applied to the heat sink to control the temperature of the junction.

To provide additional cooling, some diode packages have been filled with a liquid cooling medium. However, the coolant fluids proposed thus far have several limitations. One important limitation is that infrared frequencies emitted at the p-n junction are absorbed by the liquid. This infrared absorption decreases the optical power emitted from the package. The infrared absorption also causes an associated temperature increase which is often sufficient to raise the temperature of the coolant liquid to its boiling point. The resulting formation of vapor bubbles at the junction is highly undesirable. The bubbles create an insulating vapor layer at the junction, the point of highest temperature of the die, resulting in significantly decreased cooling efficiency. The bubbles also optically distort beam quality, a problem which is even more pronounced because the bubbles are formed at the very point where the optical beams exit the die.

Beam quality is further reduced due to the improper matching of physical properties between proposed coolant liquids, the die, the package and the air. For example, the ideal ratio of the refractive indices of the die and the coolant liquid is not attained, meaning that less light is emitted from the diode due to reflections at the diode-liquid boundary. A similar mismatching between the liquid and the package material means that more reflections occur at the liquid package boundary. These reflections greatly reduce the amount and quality of light emitted from the package.

SUMMARY OF THE INVENTION

In contrast to this teaching the present invention provide a package which provides direct liquid cooling of the P-N junction. Although the package is useful for LED applications, the package is particularly useful when used with LASER diodes. The package includes a closed capsule which contains liquid cooling medium. The package may include a window or other device for coupling the optical energy out of the package.

BRIEF DESCRIPTION OF THE DRAWINGS

In the drawings in which like reference numerals indicate corresponding parts throughout.

DESCRIPTION OF THE PREFERRED EMBODIMENT

Figure 1:
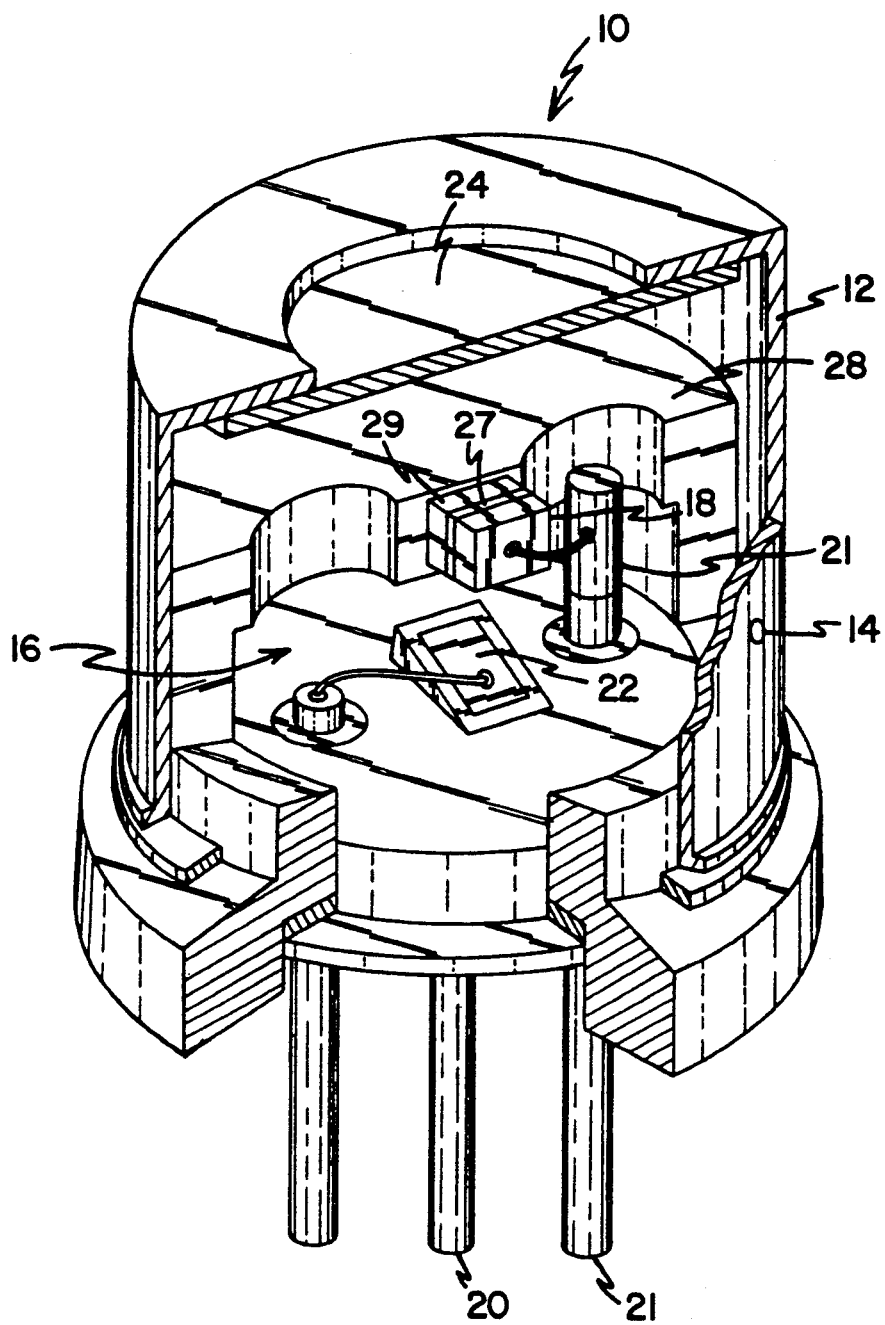
FIG. 1 is a diagram of an embodiment of the invention and, FIG. 2 is a graph of the power output characteristics of the invention.

FIG. 1 shows a package 10 which is generally cylindrical in form. This capsule contains a cooling fluid 16 which substantially fills the interior of the package or cavity. A small port 14 may be provided to fill the capsule. The preferred cooling fluid is liquid fluorocarbon. The preferred coolant is manufactured under the trade name Fluorinert, and this product may be purchased from 3M Company, St. Paul. Minn. The preferred member of the Fluorinert family depends upon the power dissipation required by the semiconductor chip 18. It is highly desirable to prevent boiling of the coolant at the P-N junction and this requirement can be used to select the specific heat capacity and boiling point for the Fluorinert. Preferably, the Fluorinert exhibits a specific heat of 0.25 g-cal/g-C. and has a boiling point greater than 96° C. and less than 216° C. The infrared absorption spectra of liquid fluorocarbons is highly advantageous for purposes of the optical semiconductor package of the present invention. Less than 5 percent of infrared frequencies above 1500 $cm^{-1}$ are absorbed by liquid fluorocarbons. The low infrared absorption by a liquid fluorocarbon means that more optical power is emitted from the package. The low infrared absorption also means that although a liquid fluorocarbon may have a boiling point similar to other liquid coolants, a liquid fluorocarbon is less likely to boil in a packaged environment such as that of the preferred embodiment of the present invention. This is because infrared frequencies, one of the main sources for temperature increases in the liquid, are not absorbed by the liquid fluorocarbon. Other liquid coolants absorb a significant percentage of infrared frequencies emitted by the die, causing an associated temperature increase in the liquid which is often sufficient to raise the temperature of the liquid to its boiling point.

In contrast, the worst case temperature rise of a liquid fluorocarbon when cooling a typical 100 milliwatt LASER diode is well below 5° C. Because the boiling point of the preferred liquid fluorocarbon, Fluorinert, is above 90° C., and the normal operating temperature of the diode package is room temperature (37° C.), it can be seen that the liquid fluorocarbon will remain well below the boiling point, even under worst case conditions. The fact that the fluorocarbon temperature remains essentially constant also greatly increases the efficiency of the cooling.

There are numerous advantages derived in preventing the liquid coolant from boiling. First, the temperature increase in the liquid greatly reduces the efficiency with which heat is transferred through the liquid away from the die. Also, if boiling occurs, vapor bubbles formed thereby optically distort beam quality and beam direction due to the lensing effects of the differences in the index of refraction between the liquid and the vapor. The vapor bubbles are created randomly and the distortion induced thereby renders the laser beam and its optical properties uncontrollable. Further, formation of vapor bubbles occurs first and most vigorously on the optical facets, i.e., the surfaces where the laser beam exits the die, as these facets are the highest temperature surfaces on the die. As the vapor bubbles form, they stick to the facets until they grow to a size that allows their buoyancy to overcome surface tension. This creates an insulating vapor layer at the points of highest temperature on the surface of the die, i.e. the facets, which is exactly what one wishes to avoid if one is trying to cool the laser efficiently. Additionally, the location of bubble formation makes the optical distortion even more pronounced as the bubbles form a the points the optical beams exit the die.

Also, the change of state cooling which takes place in a boiling liquid, wherein the liquid changes to a vapor at the die and condenses back to a liquid at the housing, is highly inefficient compared to cooling which occurs in a low temperature non-boiling fluid, especially when compared with the packaging scheme of the present invention wherein the liquid temperature remains essentially constant.

There are further advantages to using liquid fluorocarbon as the preferred coolant. For example, the refractive index of the preferred liquid fluorocarbon, Fluorinert, (refractive index 1.3), provides the nearly ideal liquid/die refractive index ratio so that the correct ratio of reflected to emitted light is achieved so that as much light as possible is emitted from the diode instead of being reflected back in at the die-liquid boundary. If the refractive index of the coolant liquid is too low, not enough light is emitted from the package. If the refractive index of the coolant liquid is too high, not enough light is reflected back into the die to sustain the feedback requirements of a LASER diode.

In operation the LASER diode chip 18 is forward biased by supplying electrical power to the terminals 20 and 21. A photo diode 22 may be provided to monitor the optical power output. This sensor may also form a sensor to for a drive current control system. As shown in FIG. 1 the diode chip is mounted so that it is aligned with a window 24. The support 28 may form an electrical connection for the diode as shown in this Figure. The optical energy is emitted from the chip normal to the plane of P-N junction. The figure illustrates that the P-N junction 27 is separated from the heat sinking support 28 by the bulk P channel material 29. However the junction 27 is substantially completely surrounded by the Fluorinert which fills the cavity.

Figure 2:
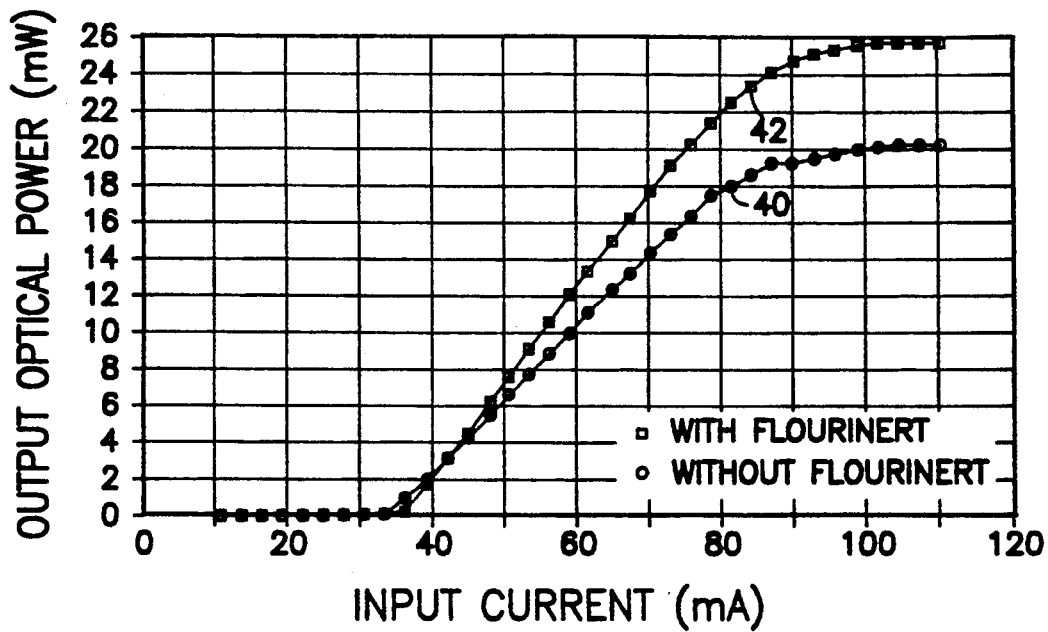
Figure 3:
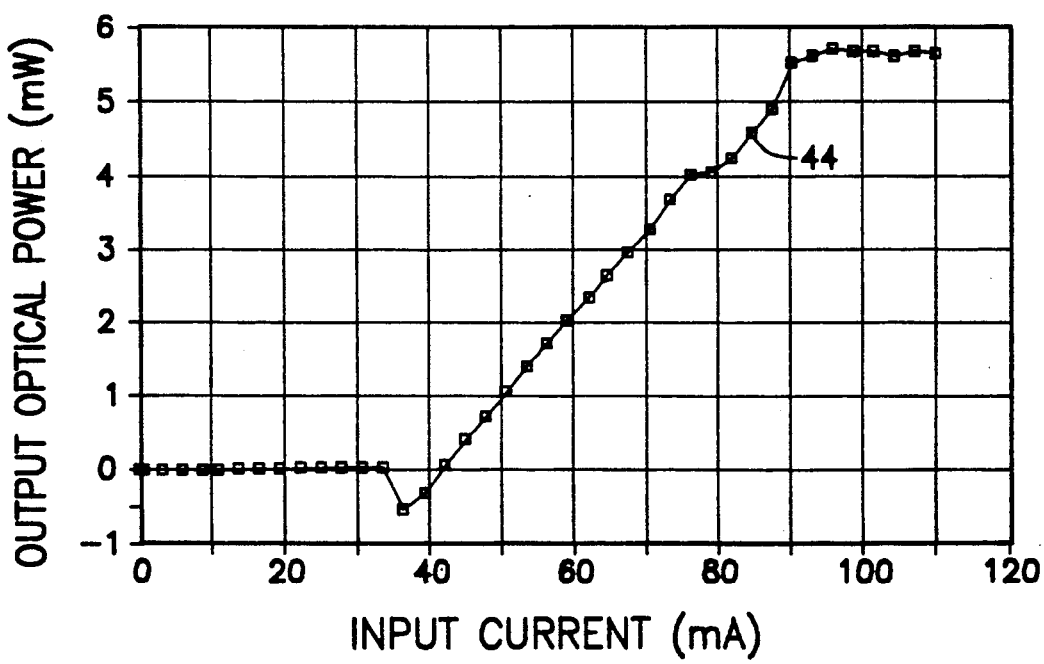
FIG. 3 is a graph computed from the data presented in FIG. 2.

In general the optical power output is a function of the forward current. FIG. 2 is a graph drawn from experimental data depicting the optical power output as a function of forward drive current. The first curve 40 is taken from a Mitsubishi ME-4402 LASER diode which has the P-N junction operated in a gaseous atmosphere. The second curve 42 is taken with the same diode however the P-N junction is submerged in Fluorinert. The graph set forth as FIG. 3 is computed form the FIG. 2 data set and displays a curve 44 which shows the difference in output power as a function of the input current supplied to the LASER diode. This figure demonstrates that the output power from the diode is increased by submerging the diode in the Fluorinert. Experimental work suggest that this observed effect is not the result of improved optical coupling but is directly attributable to operating the P-N junction in the Fluorinert.

The figure also shows an increase in the amount of drive current required to start the LASER action in comparison with the p-n junction operated in air. It is believed that this effect is caused by the higher index of refraction exhibited by the Fluorinert which causes the loss of photons out of the laser cavity. As a consequence it is believed that more current is required to achieve the LASER threshold.

Figure 4:
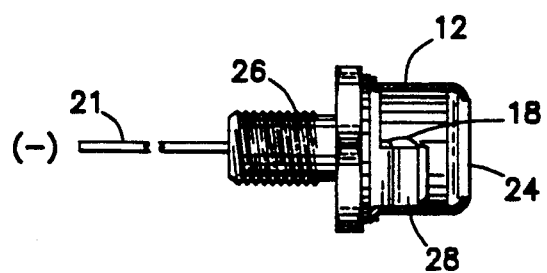
FIG. 4 is an alternate embodiment of the invention.

FIG. 4 shows an alternate embodiment of the present invention. In this figure the diode is mounted on stud 26 which forms a heat sink for the device. The stud 26 encloses a cylindrical cavity formed by wall 12 and window 24. The anode of the diode is connected to a stud 26 which functions as a support and an electrical connection for the semiconductor laser chip 18.

Figure 5:
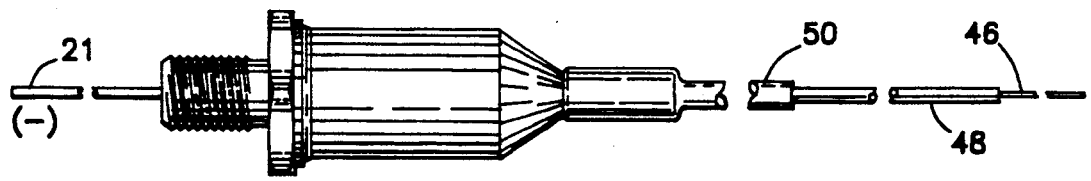
FIG. 5 is an alternate embodiment of the invention.

FIG. 5 shows a pig-tail version of the package shown in FIG. 4. In this embodiment an optical fiber 46 is positioned within the cavity to couple light energy from the chip 18 to the fiber. The fiber itself may be covered with a protective sheath 48 which is connected to the capsule with a strain relief 50.

It is apparent from the foregoing description of illustrative embodiments of the invention that many alterations could be made to the package without departing from the scope of the invention.

What is claimed is:

1. A package for a laser diode, comprising:
   a closed capsule defined by a floor, a plurality of walls and a windowed cover, the windowed cover adapted to emit optical energy from the package;
   a laser diode adapted to convert electrical energy into optical energy, the laser diode mounted transversely to the floor of said capsule;
   detector means positioned between the floor and the laser diode, for monitoring the optical energy emitted from the laser diode; and
   cooling means in the capsule, including a liquid fluorocarbon, for cooling the laser diode, the cooling means having:
      a boiling point above a 42° C. operating temperature of the cooling means which prevents boiling of the cooling means during use of the package, prevents formation of vapor bubbles in the package, prevents distortion of the optical energy emitted from the package, and further prevents formation of an insulating vapor layer on the laser diode;
      an index of refraction related to an index of refraction of the laser diode which maximizes the optical energy emitted from the package while reflecting sufficient optical energy to sustain feedback requirements of the laser diode; and
      an absorption spectra of less than 5% to infrared frequencies emitted by the laser diode.

* * * * *